(12) United States Patent
Yun et al.

(10) Patent No.: US 10,726,966 B2
(45) Date of Patent: Jul. 28, 2020

(54) METHOD OF FORMING CONDUCTIVE POLYMER THIN FILM PATTERN

(71) Applicant: KOREA INSTITUTE OF INDUSTRIAL TECHNOLOGY, Cheonan-si, Chungcheongnam-do (KR)

(72) Inventors: Changhun Yun, Gwangju (KR); Hyeck Go, Gwangju (KR)

(73) Assignee: Korea Institute of Industrial Technology, Cheonan-si, Chungcheongnam-do (KR)

( * ) Notice: Subject to any disclaimer, the term of this patent is extended or adjusted under 35 U.S.C. 154(b) by 0 days.

(21) Appl. No.: 16/177,818

(22) Filed: Nov. 1, 2018

(65) Prior Publication Data
US 2020/0006660 A1 Jan. 2, 2020

(30) Foreign Application Priority Data

Jun. 27, 2018 (KR) .......................... 10-2018-0073788

(51) Int. Cl.
*H01L 51/52* (2006.01)
*H01B 1/12* (2006.01)
(Continued)

(52) U.S. Cl.
CPC .............. *H01B 1/128* (2013.01); *H01B 1/127* (2013.01); *H01L 33/42* (2013.01);
(Continued)

(58) Field of Classification Search
CPC ......... H01B 1/128; H01B 1/127; H01L 33/42; H01L 51/5206; H01L 51/5234; C08L 43/00; C08L 25/18; C08L 2207/53
See application file for complete search history.

(56) References Cited

U.S. PATENT DOCUMENTS

2019/0144379 A1* 5/2019 Kim .................... H01L 51/5221
430/281.1

FOREIGN PATENT DOCUMENTS

| CN | 103022362 A | 4/2013 |
|---|---|---|
| JP | 2015-079966 A | 4/2015 |

(Continued)

OTHER PUBLICATIONS

Yijie Xia et al., "Solution-Processed Metallic Conducting Polymer Films as Transparent Electrode of Optoelectronic Devices", Advanced Materials, 2012, pp. 2436-2440, vol. 24.

*Primary Examiner* — Yasser A Abdelaziez
(74) *Attorney, Agent, or Firm* — Rabin & Berdo, P.C.

(57) ABSTRACT

Disclosed is a method of forming a conductive polymer thin film pattern, including (a) Coating substrate with solution including PEDOT:PSS (poly(3,4-ethylenedioxythiophene):poly(styrene sulfonate)) to form coating layer including solution on substrate, (b) irradiating a predetermined portion of the coating layer with light, thus manufacturing a pre-patterned substrate including PEDOT:PSS patterned on the predetermined portion and the coating layer other than the predetermined portion, and (c) removing the coating layer from the pre-patterned substrate, thus manufacturing a conductive polymer thin film having a PEDOT:PSS pattern. When the pattern formation method of the invention is applied, a pattern can be formed by directly irradiating a PEDOT:PSS solution with a laser, there is no need for additional drying, thus simplifying the processing and reducing the processing time, and a thin film for use in a transparent electrode can be manufactured, thereby improving the conductivity, transmittance, flatness and precision of the electrode.

16 Claims, 14 Drawing Sheets

(51) Int. Cl.
*H01L 33/42* (2010.01)
*C08L 25/18* (2006.01)
*C08L 43/00* (2006.01)

(52) U.S. Cl.
CPC ...... *H01L 51/5206* (2013.01); *H01L 51/5234* (2013.01); *C08L 25/18* (2013.01); *C08L 43/00* (2013.01); *C08L 2207/53* (2013.01)

(56) References Cited

FOREIGN PATENT DOCUMENTS

| | | |
|---|---|---|
| KR | 10-2013-0035158 A | 4/2013 |
| KR | 10-1729686 B1 | 4/2017 |
| KR | 10-2018-0027277 A | 3/2018 |

\* cited by examiner

Example 3-1

No soft bake

Example 3-2

Soft bake
- 70 °C 30sec
Hot plate

Example 4-1

METHOD OF FORMING CONDUCTIVE POLYMER THIN FILM PATTERN

BACKGROUND OF THE INVENTION

1. Technical Field

The present invention relates to a method of forming a conductive polymer thin film pattern, and more particularly to a modified PEDOT:PSS (poly(3,4-ethylenedioxythiophene):poly(styrene sulfonate)), a method of preparing the same, and a method of forming a PEDOT:PSS pattern having high conductivity by subjecting a substrate to solution coating with PEDOT:PSS and then performing direct light irradiation before complete drying.

2. Description of the Related Art

A transparent electrode is an indispensable component of displays such as LCDs and OLEDs, touch panels, and thin-film solar cells. Although indium tin oxide (ITO) is currently mainly used as a transparent electrode material, thorough research is ongoing into flexible transparent electrodes able to replace ITO due to the increase in price owing to the scarcity of indium and the lack of mechanical flexibility required for next-generation flexible electronic devices. Examples of candidate materials thereof may include carbon-based materials such as carbon nanotubes and graphene, metal-based materials such as metal meshes, metal nanowires and ultra-thin-film metals, metal oxides, and the like. However, the transparent electrodes that have been developed to date have very low conductivity, and thus an improvement in the conductivity thereof is urgently required.

As an alternative to ITO for the transparent electrode, conductive polymers are receiving attention. Conductive polymers, which are composed of organic material, have the typical advantages of plastics, such as processability, light weight, flexibility, simple coating processing, and low production costs, and are also electrically conductive, like metals, and have high transmittance in the visible light range. However, as described above, the low conductivity of conductive polymers is problematic when used in lieu of ITO.

PEDOT:PSS (poly(3,4-ethylenedioxythiophene):poly(styrene sulfonate)) is a conductive plastic material having high conductivity, has high transmittance in the visible light range, is dissolved in water to thus enable an environmentally friendly solution process, and is very stable, and is thus widely used as a conductive polymer. However, the electrical conductivity of PEDOT:PSS is about 0.1 to 1 S/cm, which is too low to be used for a transparent electrode, and is also very low compared to that of ITO (>5,000 S/cm).

Over the past several decades, thorough research has been carried out into the optical and electrical characteristics of PEDOT:PSS, and many attempts have been made to improve conductivity through treatment with various organic solvents, surfactants and acids. Non-Patent Document 1 has recently reported electrical conductivity of 3,065 S/cm, achieved by dropping a 1.0 M sulfuric acid ($H_2SO_4$) solution onto a PEDOT:PSS thin film. Also, Patent Document 1 discloses a technique for improving conductivity by adding an acetone organic solvent to PEDOT:PSS.

However, Non-Patent Document 1 does not provide an optimal preparation method in order to improve conductivity and does not realize electrical characteristics enabling replacement of ITO, and thus limitations are imposed on practical commercialization, and Patent Document 1 has a problem in that coatability is significantly reduced.

Thus, it is necessary to develop a technique for manufacturing a transparent electrode having high conductivity and high transmittance while improving the conductivity of a conductive polymer (PEDOT:PSS).

CITATION LIST

Patent Literature (Patent Document 0001) KR 10-1729686 B
(Patent Document 0002) KR 10-2018-0027277 A

Non-Patent Literature (Non-Patent Document 0001) Yijie Xia, Kuan Sun, and Jianyong Ouyang, Solution-Processed Metallic Conducting Polymer Films as Transparent Electrode of Optoelectronic Devices, Advanced Materials 2012, 24, 2436-2440

SUMMARY OF THE INVENTION

Accordingly, the present invention has been made keeping in mind the problems encountered in the related art, and the present invention is intended to provide a thin film including PEDOT:PSS having improved conductivity using modified PEDOT:PSS.

In addition, the present invention is intended to provide a method of forming a pattern by directly irradiating a PEDOT:PSS solution with light.

In addition, the present invention is intended to provide a method of forming a pattern in which processing is simplified without the need for additional drying, and the processing time may be shortened, and a method of manufacturing a thin film.

In addition, the present invention is intended to provide a method of forming a pattern by directly irradiating a PEDOT:PSS solution with light, thereby increasing the conductivity and transmittance of a transparent electrode including the pattern.

An aspect of the present invention provides a method of forming a conductive polymer thin film pattern, comprising: (a) coating a substrate with a solution including PEDOT:PSS, thus forming a coating layer including the solution on the substrate; (b) irradiating a predetermined portion of the coating layer with light, thus manufacturing a pre-patterned substrate including PEDOT:PSS patterned on the predetermined portion and the coating layer other than the predetermined portion; and (c) removing the coating layer from the pre-patterned substrate, thus manufacturing a conductive polymer thin film having a PEDOT:PSS pattern.

Here, the light may include at least one selected from among a laser, a multi-wavelength lamp, a xenon lamp, a single-wavelength lamp, a monochromator, a flash lamp, and an optical tool using the same as a light source.

The above method may further comprise subjecting the coating layer to soft baking, after step (a).

The soft baking may be performed through heat treatment at a temperature ranging from 10 to 200° C. to evaporate a portion of the solvent of the coating layer.

The soft baking may be performed for 1 to 1,000 sec.

The solution may include a PEDOT:PSS polymer and a solvent.

The solution may have a concentration of 0.1 to 10 wt %.

The solvent may be a polar solvent.

The solution may further include a conductive material.

The conductive material may further include at least one selected from among gold (Au), nickel (Ni), cobalt (Co), iridium (Ir), aluminum (Al), silver (Ag), titanium (Ti), vanadium (V), chromium (Cr) and manganese (Mn).

In step (b), the solvent contained in the PEDOT:PSS solution may evaporate through light irradiation.

In step (b), the coating layer may be directly irradiated with light.

The wavelength of the light may be 500 nm to 10 μm.

The intensity of the light may be $1\times10^7$ to $1\times10^{10}$ W/cm$^2$·nm per unit area (1 cm$^2$) of a 1 nm thick PEDOT:PSS thin film.

In step (b), the PEDOT:PSS patterned on the predetermined portion may be solidified.

In step (c), the removing the coating layer may be performed by dipping or washing the pre-patterned substrate in or with a washing solvent.

The washing solvent, which efficiently dissolves PEDOT:PSS, may include water, alcohol (methanol, ethanol, IPA, 2-ethoxyethanol, etc.), glycol (ethylene glycol, etc.), ketone (acetone, etc.), and solvent mixtures of two or more thereof.

The dipping process may be performed in a manner in which the pre-patterned substrate is dipped in a bath containing the solvent, and the washing process may be performed in a manner in which the solvent is applied through spraying onto the pre-patterned substrate.

The removing the coating layer may be performed for 1 to 1,000 sec.

After step (c), the surplus solvent may be completely removed through blowing or additional heating.

The substrate may include at least one selected from among glass, a plastic substrate, polyethylene terephthalate (PET), polyethylene naphthalate (PEN), polycarbonate (PC), polyimide (PI), polydimethylsiloxane (PDMS), and polyurethane.

In step (b), heat may be generated inside the PEDOT:PSS polymer contained in the coating layer through light irradiation.

The resistance of the PEDOT:PSS polymer may be decreased due to the heat thus generated.

The conductive polymer thin film having a PEDOT:PSS pattern may have a thickness of 5 nm to 5 μm.

Another aspect of the present invention provides a modified PEDOT:PSS core-shell cluster, comprising a plurality of modified PEDOT:PSS core-shells, any one modified PEDOT:PSS core-shell among the plurality of modified PEDOT:PSS core-shells comprising: a core containing PEDOT; a shell containing PSS, positioned on a portion of the surface of the core; and a connector containing PEDOT, positioned on all or part of the remaining portion of the surface of the core and connected or adjacent to a core of an additional modified PEDOT:PSS core-shell adjacent to the modified PEDOT:PSS core-shell.

The core-shell cluster may be used for the formation of a modified PEDOT:PSS thin film having improved conductivity.

The modified PEDOT:PSS core-shell cluster may be used for the formation of a thin film or a pattern.

Still another aspect of the present invention provides a method of manufacturing a modified PEDOT:PSS core-shell cluster, comprising: (1) irradiating a plurality of PEDOT:PSS core-shells, each including a core containing PEDOT and a shell containing PSS, positioned on the surface of the core, with light, thus heating the cores; and (2) transferring heat of the heated cores to the shells so that the shells are partially melted and rearranged, thus forming a connector for connecting the cores adjacent to each other and containing PEDOT, thereby obtaining a modified PEDOT:PSS core-shell cluster.

According to the present invention, modified PEDOT:PSS can be provided, thus improving the conductivity and properties of a thin film including PEDOT:PSS.

Also, according to the present invention, a method of forming a conductive polymer pattern enables the formation of a pattern by directly irradiating a PEDOT:PSS solution with light.

Also, when the method of forming a pattern according to the present invention is used, there is no need for additional drying, thus simplifying the processing and reducing the processing time.

Also, a thin film for use in a transparent electrode can be manufactured by forming a pattern through direct irradiation of a PEDOT:PSS solution with light, thereby improving the conductivity, transmittance, flatness and precision of the electrode.

DESCRIPTION OF SPECIFIC EMBODIMENTS

The present invention may be embodied in many different forms, and should not be construed as being limited only to the embodiments set forth herein, but should be understood to cover all modifications, equivalents or alternatives falling within the ideas and technical scope of the present invention. In the description of the present invention, detailed descriptions of related known techniques incorporated herein will be omitted when the same may make the gist of the present invention unclear.

As used herein, the terms "first", "second", etc. may be used to describe various elements, but these elements are not to be limited by these terms. These terms are only used to distinguish one element from another. For example, a first element may be termed a second element, and similarly, a second element may be termed a first element, without departing from the scope of the present invention.

Further, it will be understood that when an element is referred to as being "formed" or "stacked" on another element, it can be formed or stacked so as to be directly attached to all surfaces or to one surface of the other element, or intervening elements may be present therebetween.

Unless otherwise stated, the singular expression includes a plural expression. In this application, the terms "comprise", "include" or "have" are used to designate the presence of features, numbers, steps, operations, elements, parts, or combinations thereof described in the specification, and should be understood as not excluding the presence or additional possible presence of one or more different features, numbers, steps, operations, elements, parts, or combinations thereof.

Figure 1:
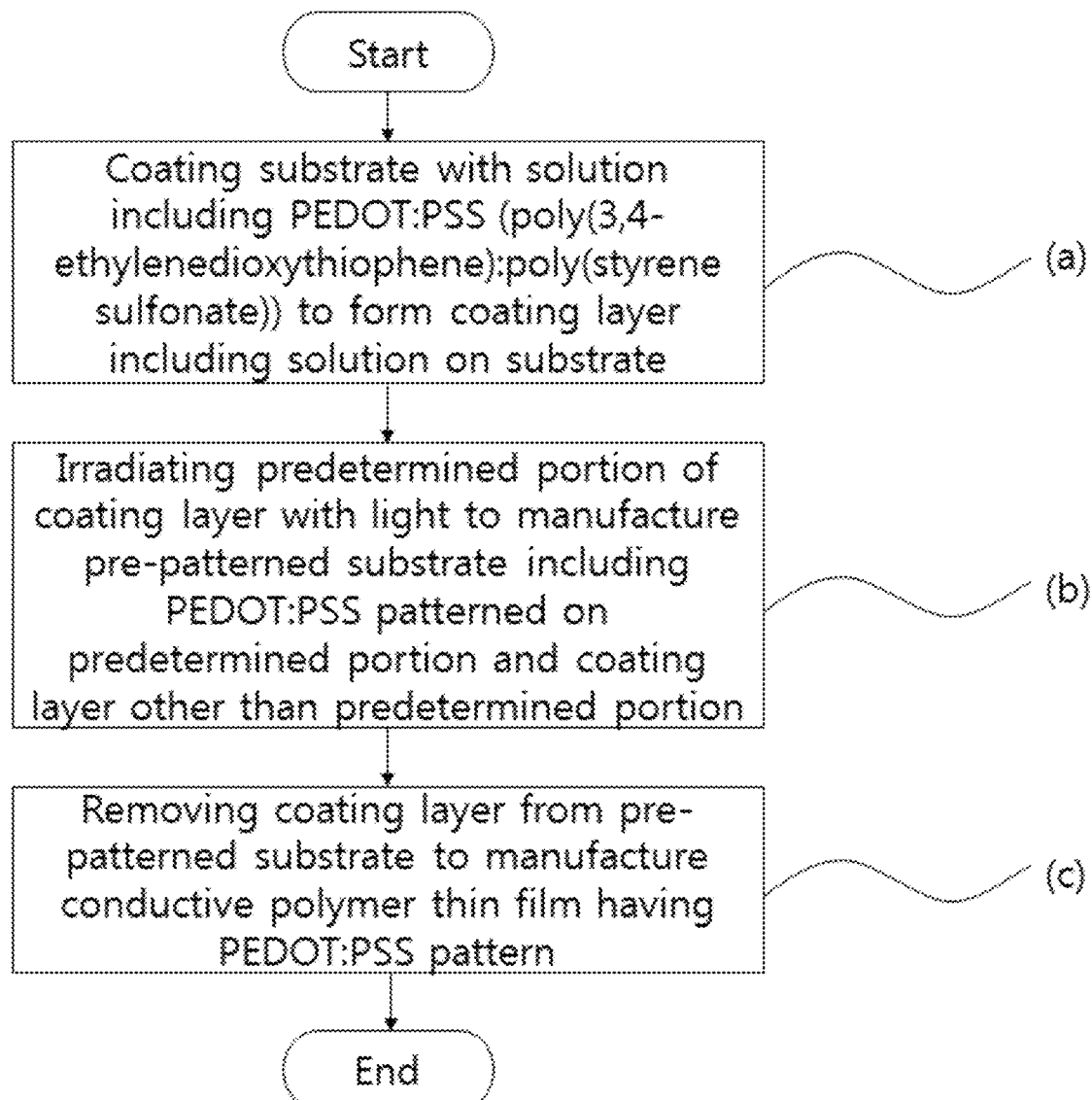
FIG. 1 is a flowchart showing a process of manufacturing a conductive polymer thin film having a PEDOT:PSS pattern using light according to an embodiment of the present invention.
Figure 2:
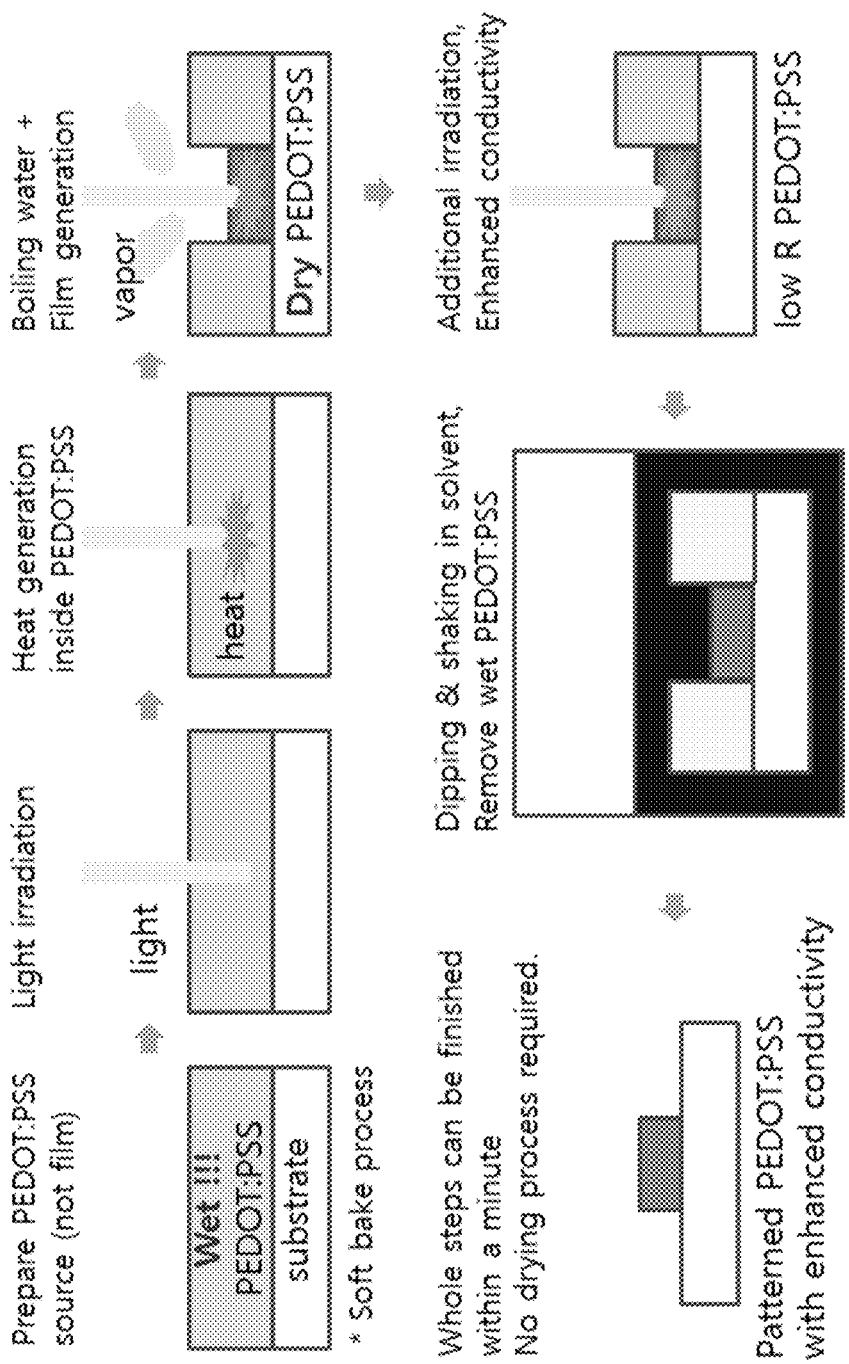
FIG. 2 schematically shows the process of manufacturing a conductive polymer thin film having a PEDOT:PSS pattern using light according to an embodiment of the present invention.

FIG. 1 is a flowchart showing a process of forming a PEDOT:PSS thin film pattern according to the present invention, and FIG. 2 is a schematic view sequentially showing the process of forming the PEDOT:PSS thin film pattern according to the present invention.

Below is a description of the method of forming the PEDOT:PSS thin film pattern according to the present invention, made with reference to FIGS. 1 and 2.

Specifically, a Substrate is Coated with a Solution Including PEDOT:PSS (Poly(3,4-Ethylenedioxythiophene):Poly (Styrene Sulfonate)), Thus Forming a Coating Layer Including the Solution on the Substrate (Step a).

The solution may further include a conductive material.

The conductive material may include gold (Au), nickel (Ni), cobalt (Co), iridium (Ir), aluminum (Al), silver (Ag), titanium (Ti), vanadium (V), chromium (Cr), manganese (Mn), etc.

The conductive material may be provided in the form of nanoparticles or nanowires.

After step (a), subjecting the coating layer to soft baking may be further performed.

The soft baking is carried out through heat treatment at a temperature ranging from 10 to 200° C., preferably 20 to 100° C., and more preferably 30 to 80° C., in order to evaporate a portion of the solvent of the coating layer. If the soft baking temperature is lower than 10° C., the soft baking time may become long and the soft baking effect is insignificant. On the other hand, if the soft baking temperature is higher than 200° C., the shape of the coating layer is not smooth and the precision of the thin film pattern may decrease, which is undesirable.

The soft baking may be performed for 1 to 1,000 sec, preferably to 800 sec, and more preferably 10 to 300 sec.

If the soft baking time is less than 1 sec, the soft baking effect is insignificant. On the other hand, if the soft baking time exceeds 1,000 sec, the precision of the thin film pattern may decrease, which is undesirable.

The solution may contain a PEDOT:PSS polymer and a solvent.

The solvent may be a polar solvent, and preferably includes water, alcohol (methanol, ethanol, IPA, 2-ethoxyethanol, etc.), glycol (ethylene glycol, etc.), ketone (acetone, etc.), and the like. Also, a solvent mixture of two or more thereof may be used, and preferably water, alcohol or a mixture thereof is used.

Also, in order to enhance performance of step (a), the solution may further contain a small amount of additive including a nonionic fluorosurfactant (FS-31, available from Dupont) or dimethyl sulfoxide (DMSO).

The concentration of the solution is 0.1 to 10.0 wt %, preferably 0.5 to 5 wt %, and more preferably 1.0 to 4.0 wt %.

The substrate may include glass, a plastic substrate, polyethylene terephthalate (PET), polyethylene naphthalate (PEN), polycarbonate (PC), polyimide (PI), polydimethylsiloxane (PDMS), polyurethane, etc.

Next, Light is Radiated to a Predetermined Portion of the Coating Layer, Thus Manufacturing a Pre-Patterned Substrate Including PEDOT:PSS Patterned on the Predetermined Portion and the Coating Layer Other than the Predetermined Portion (Step b).

Through light irradiation, the solvent contained in the PEDOT:PSS solution may evaporate.

The light may include a laser, a multi-wavelength lamp, a xenon lamp, a single-wavelength lamp, a monochromator, a flash lamp, and an optical tool using the same as a light source, and preferably a laser is used.

When light is radiated to the coating layer in a solution phase including PEDOT:PSS, heat is generated inside the polymer due to the light, and the solvent contained in the solution is evaporated, whereby PEDOT:PSS may be simultaneously dried and solidified.

The coating layer may be directly irradiated with light.

Figure 10:
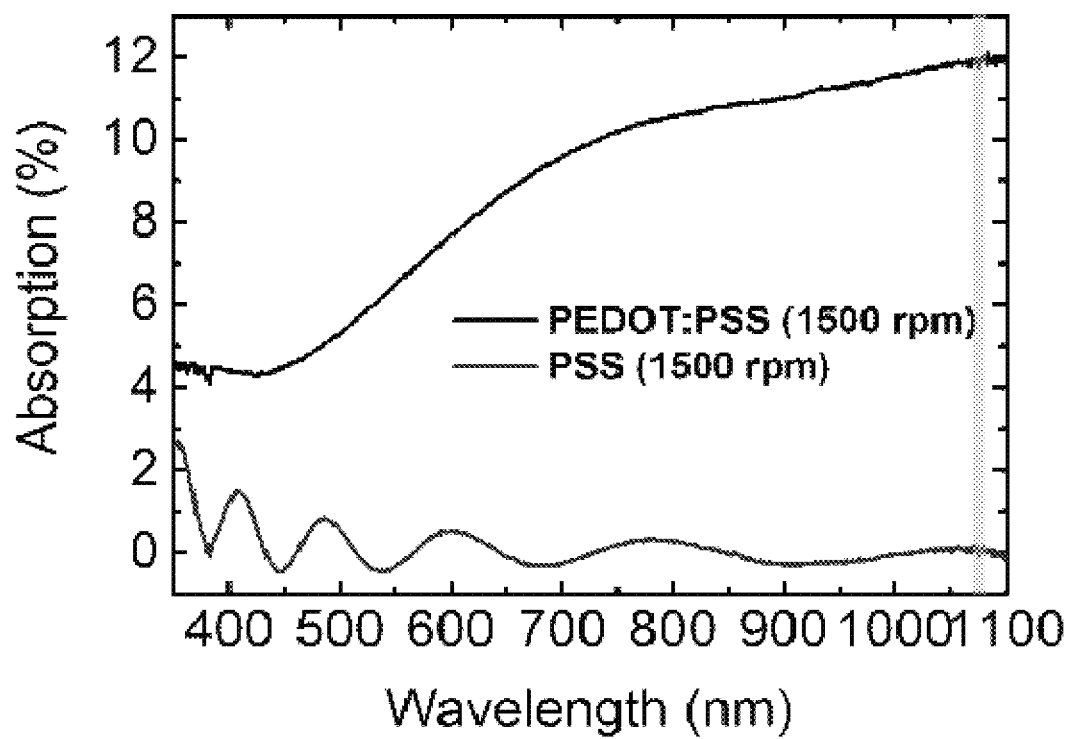
FIG. 10 shows the results of measurement of light absorption of a PEDOT:PSS thin film and a PSS thin film.

The wavelength of the light ranges from 500 nm to 10 μm, preferably 600 nm to 5 μm, and more preferably 800 nm to 3 μm. With reference to FIG. 10, if the wavelength of the light is less than 500 nm, the light absorption efficiency of PEDOT:PSS may decrease and thus the solvent does not evaporate, making it difficult to manufacture a pre-patterned substrate. On the other hand, if the wavelength of the light exceeds 10 μm, light may be absorbed by a typical transparent substrate, and thus physical damage to the transparent substrate itself may occur, which is undesirable.

The intensity of the light is $1 \times 10^7$ to $1 \times 10^{10}$ W/cm$^2$·nm, preferably $5 \times 10^8$ to $5 \times 10^9$ W/cm$^2$-nm, and more preferably $1 \times 10^8$ to $1 \times 10^9$ W/cm$^2$-nm per unit area (1 cm$^2$) of a 1 nm thick PEDOT:PSS thin film. If light is radiated to the polymer solution at an intensity of less than $1 \times 10^7$ W/cm$^2$·nm, non-uniform delamination of PEDOT:PSS from the substrate may occur. On the other hand, if light is applied at an intensity exceeding $1 \times 10^{10}$ W/cm$^2$-nm, carbonization of PEDOT:PSS may occur, and thus the resistance of the formed thin film may drastically increase, or delamination may not occur after carbonization, which is undesirable.

The PEDOT:PSS patterned on the predetermined portion may be solidified, and this solidification occurs while the solvent contained in the coating layer evaporates due to light.

When light is radiated in this way, heat may be generated inside the PEDOT:PSS polymer contained in the coating layer, and the structure of the PEDOT:PSS polymer thin film may change due to the heat thus generated, thereby lowering resistance.

Specifically, the PEDOT:PSS solution coating layer may absorb the energy of the light that is radiated, thus generating heat inside the PEDOT:PSS polymer, and polymer chain rearrangement occurs through heat generation, consequently improving electrical conductivity.

By virtue of the heat generated inside the coating layer due to the light (laser), polymer chain rearrangement may occur in the PEDOT:PSS solution to thus macroscopically connect PEDOT molecules, thereby forming a PEDOT:PSS thin film having changed properties, ultimately increasing the overall conductivity of the thin film.

Finally, the Coating Layer is Removed from the Pre-Patterned Substrate, Thus Obtaining a Conductive Polymer Thin Film Having a PEDOT:PSS Pattern (Step c).

In step (c), removal of the coating layer from the pre-patterned substrate may be performed through dipping or washing using a washing solvent.

The washing solvent, which efficiently dissolves PEDOT:PSS, may include water, alcohol (methanol, ethanol, IPA, 2-ethoxyethanol, etc.), glycol (ethylene glycol, etc.), ketone (acetone, etc.), and solvent mixtures of two or more thereof.

The dipping process is performed in a manner in which the pre-patterned substrate is dipped in a bath containing the washing solvent, and the washing process is performed in a manner in which the washing solvent is applied through spraying onto the pre-patterned substrate.

Removal of the coating layer may be performed for 1 to 1,000 sec.

After step (c), the surplus washing solvent may be completely removed through blowing or additional heating.

The thickness of the conductive polymer thin film having a PEDOT:PSS pattern is 5 nm to 5 µm, preferably 10 to 500 nm, and more preferably 50 to 300 nm.

Figure 3:
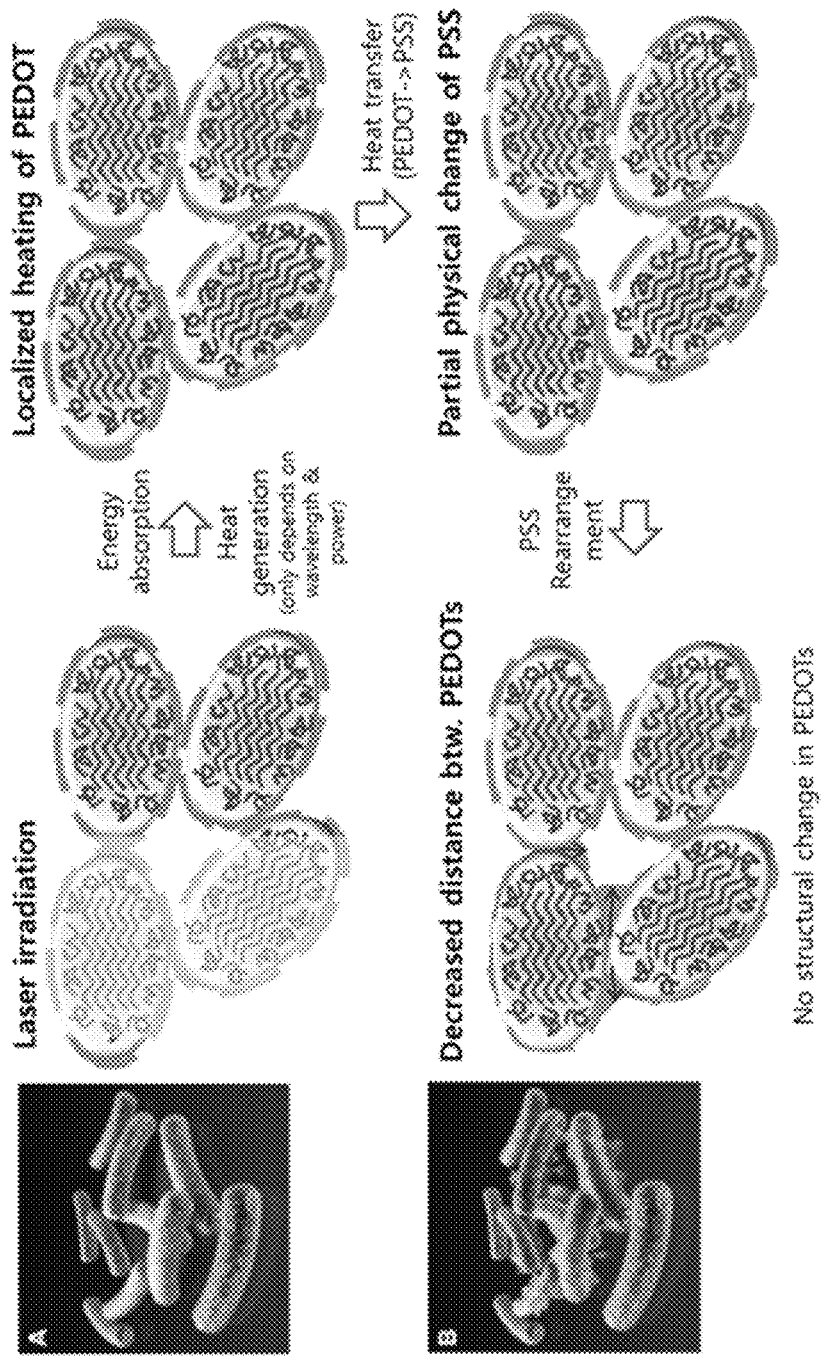
FIG. 3 schematically shows a process of forming a modified PEDOT:PSS core-shell according to an embodiment of the present invention.

FIG. 3 schematically shows the process of modifying a PEDOT:PSS polymer according to an embodiment of the present invention.

With reference to FIG. 3, a modified PEDOT:PSS core-shell and a modified PEDOT:PSS core-shell cluster according to the present invention are described.

The present invention pertains to a modified PEDOT:PSS core-shell cluster, comprising a plurality of modified PEDOT:PSS core-shells, any one PEDOT:PSS core-shell among the plurality of modified PEDOT:PSS core-shells comprising: a core containing PEDOT; a shell containing PSS, positioned at a portion of the surface of the core; and a connector containing PEDOT, positioned on all or part of the remaining portion of the surface of the core and connected or adjacent to the core of an additional modified PEDOT:PSS core-shell adjacent to the above modified PEDOT:PSS core-shell.

A modified PEDOT:PSS thin film having improved conductivity may be formed using the modified PEDOT:PSS core-shell cluster.

The modified PEDOT:PSS core-shell cluster may be used to form a thin film or a pattern.

According to the present invention, the modified PEDOT:PSS core-shell and the modified PEDOT:PSS core-shell cluster may be manufactured as follows.

Specifically, light is radiated to a plurality of PEDOT:PSS core-shells, each including a core containing PEDOT and a shell containing PSS, positioned on the surface of the core, thus heating the cores (step 1).

Next, heat of the heated cores is transferred to the shells and thus the shells may be partially melted and thus rearranged, thus forming a connector for connecting the cores adjacent to each other and containing the PEDOT, thereby manufacturing a modified PEDOT:PSS core-shell cluster (step 2).

The heat of the heated cores may be transferred to the shells, whereby some of the shells may be melted to thus cause physical rearrangement thereof.

When light is radiated to the PEDOT:PSS core-shell, PEDOT of the core absorbs light to thus generate heat, which is then transferred to the shell containing PSS formed on the surface of PEDOT. The PSS, having low heat resistance, is melted due to heat transferred from the PEDOT, and thus a portion of the PEDOT is exposed and the PSS is rearranged. Here, PEDOT molecules exposed due to rearrangement become adjacent to each other, thereby improving electrical conductivity.

Thereby, the modified PEDOT:PSS core-shell cluster, comprising the PEDOT:PSS core-shells in which electricity efficiently flows inside the cores containing PEDOT but does not flow between shells containing PSS, is formed, thereby improving electrical conductivity.

A better understanding of the present invention will be given through the following examples, which are merely set forth to illustrate but are not to be construed as limiting the scope of the present invention.

EXAMPLES

Preparation Example 1: Preparation of PEDOT:PSS Solution 3.0 to 4.0% of a poly(3,4-ethylenedioxythiophene)-poly(styrene sulfonate) aqueous solution (high-conductivity grade), available from Sigma Aldrich, was used.

Example 1: Formation of Pattern Depending on Changes in Light Power of Laser Light Source and Preparation of Thin Film Example 1-1

A polymer solution including PEDOT:PSS of Preparation Example 1 was applied through spin coating on a transparent glass substrate, thus forming a coating layer including the PEDOT:PSS solution having a thickness of 130 nm after final drying.

Thereafter, soft baking was performed on a hot plate at 25° C. for 30 sec, thus manufacturing a soft-baked coating layer.

The coating layer thus formed was irradiated with a Nd:YAG (neodymium-doped yttrium aluminum garnet; Nd:$Y_3Al_5O_{12}$) continuous-wave laser, thus forming a pre-patterned substrate including patterned PEDOT:PSS and the coating layer other than the patterned PEDOT:PSS.

Here, the laser that was used had a spot diameter of about 50 µm and a near IR wavelength of 1064 nm. Furthermore, in order to control pre-patterning conditions for the PEDOT:PSS coating layer, laser light power was adjusted to 1.5 W, and the scanning speed of the laser radiated to the PEDOT:PSS coating layer was set to 2000 mm/sec. The pre-pattern that was used had a rectangular shape having a size of 20 mm×5 mm.

Thereafter, the pre-patterned substrate was dipped in a water bath for about 1 min, thus removing the coating layer including the polymer solution not irradiated with the laser, thereby manufacturing a conductive polymer thin film having a PEDOT:PSS pattern.

Example 1-2

A thin film was manufactured in the same manner as in Example 1-1, with the exception that the laser intensity was 2.0 W in lieu of 1.5 W in Example 1-1.

Example 1-3

A thin film was manufactured in the same manner as in Example 1-1, with the exception that the laser intensity was 1.7 W in lieu of 1.5 W in Example 1-1.

Example 1-4

A thin film was manufactured in the same manner as in Example 1-1, with the exception that the laser intensity was 1.25 W in lieu of 1.5 W in Example 1-1.

Example 1-5

A thin film was manufactured in the same manner as in Example 1-1, with the exception that the laser intensity was 0.9 W in lieu of 1.5 W in Example 1-1.

Example 2: Formation of Pattern Using Laser Light Source Depending on Changes in Soft Baking Processing and Preparation of Thin Film

Example 2-1

Soft baking was performed on a hot plate at 70° C. for 30 sec after formation of a coating layer including a PEDOT:PSS solution and before irradiation with a laser, thus manufacturing a conductive polymer thin film having a PEDOT:PSS pattern.

A polymer solution including PEDOT:PSS of Preparation Example 1 was applied through spin coating on a transparent glass substrate, thus forming a coating layer including the PEDOT:PSS solution having a thickness of 130 nm after final drying.

Thereafter, soft baking was performed on a hot plate at 70° C. for 30 sec, thus manufacturing a soft-baked coating layer.

The coating layer thus formed was irradiated with a Nd:YAG continuous-wave laser, thus forming a pre-patterned substrate including patterned PEDOT:PSS and the coating layer other than the patterned PEDOT:PSS.

Here, the laser that was used had a spot diameter of about 50 μm and a near IR wavelength of 1064 nm. Furthermore, in order to control pre-patterning conditions for the PEDOT:PSS coating layer, laser light power was adjusted to 1.5 W, and the scanning speed of the laser radiated to the PEDOT:PSS coating layer was set to 2000 mm/sec.

Thereafter, the pre-patterned substrate was dipped in a water bath for about 1 min, thus removing the coating layer including the polymer solution not irradiated with the laser, thereby manufacturing a conductive polymer thin film having a PEDOT:PSS pattern.

Example 2-2

A conductive polymer thin film was manufactured in the same manner as in Example 2-1, with the exception that the soft baking was performed for 45 sec in lieu of 30 sec in Example 2-1.

Example 2-3

A conductive polymer thin film was manufactured in the same manner as in Example 2-1, with the exception that the soft baking was performed for 90 sec in lieu of 30 sec in Example 2-1.

Example 2-4

A conductive polymer thin film was manufactured in the same manner as in Example 2-1, with the exception that the soft baking was performed at 100° C. in lieu of 70° C. in Example 2-1.

Example 2-5

A conductive polymer thin film was manufactured in the same manner as in Example 2-1, with the exception that the soft baking was performed at 100° C. for 15 min in lieu of 70° C. for 30 sec in Example 2-1.

Example 3: Formation of Pattern Using Laser Light Source Depending on Whether or not Soft Baking was Performed and Preparation of Thin Film A conductive polymer thin film was manufactured in the same manner as in Example 1-1, with the exception that the pre-pattern formed through laser irradiation had a size of 20 mm×0.1 mm in lieu of 20 mm×5 mm in Example 1-1.

Example 3-1

A conductive polymer thin film was manufactured in a manner in which soft baking was not performed, but light irradiation was performed directly, after the formation of a coating layer including the PEDOT:PSS solution in Example 1-1.

Example 3-2

A conductive polymer thin film was manufactured in a manner in which soft baking was performed at 70° C. for 30 sec after the formation of a coating layer including the PEDOT:PSS solution in Example 1-1.

Example 4: Formation of Pattern Using Laser Light Source Depending on Changes in Pattern Size and Preparation of Thin Film

Example 4-1

A conductive polymer thin film was manufactured in the same manner as in Example 1-1, with the exception that the pre-pattern formed through laser irradiation had a size of 20 mm×0.05 mm in lieu of 20 mm×5 mm in Example 1-1.

The laser irradiation conditions and the soft baking conditions upon formation of the pattern through laser irradiation and preparation of the thin film in Examples 1 to 4 are summarized in Table 1 below.

TABLE 1

| No. | Laser irradiation | | | | Soft baking | | |
| --- | --- | --- | --- | --- | --- | --- | --- |
| | Diameter (μm) | Intensity (W) | Scanning speed (mm/s) | Pattern size (mm × mm) | Performed or not | Temp. (° C.) | Time (sec) |
| Example 1-1 | 50 | 1.5 | 2000 | 20 × 5 | YES | 25 | 30 |
| Example 1-2 | 50 | 2.0 | 2000 | 20 × 5 | YES | 25 | 30 |
| Example 1-3 | 50 | 1.7 | 2000 | 20 × 5 | YES | 25 | 30 |
| Example 1-4 | 50 | 1.25 | 2000 | 20 × 5 | YES | 25 | 30 |
| Example 1-5 | 50 | 0.9 | 2000 | 20 × 5 | YES | 25 | 30 |
| Example 2-1 | 50 | 1.5 | 2000 | 20 × 5 | YES | 70 | 30 |
| Example 2-2 | 50 | 1.5 | 2000 | 20 × 5 | YES | 70 | 45 |
| Example 2-3 | 50 | 1.5 | 2000 | 20 × 5 | YES | 70 | 90 |
| Example 2-4 | 50 | 1.5 | 2000 | 20 × 5 | YES | 100 | 30 |
| Example 2-5 | 50 | 1.5 | 2000 | 20 × 5 | YES | 100 | 900 |
| Example 3-1 | 50 | 1.5 | 2000 | 20 × 0.1 | No | — | — |
| Example 3-2 | 50 | 1.5 | 2000 | 20 × 0.1 | YES | 70 | 30 |
| Example 4-1 | 50 | 1.5 | 2000 | 20 × 0.05 | YES | 25 | 30 |

TEST EXAMPLES

Test Example 1: Analysis of Polymer Pattern Morphology Depending on Laser Intensity FIG. 4 shows photographs and optical images of the polymer pattern morphology when the polymer solution was irradiated with a laser at different intensities.

Figure 4:
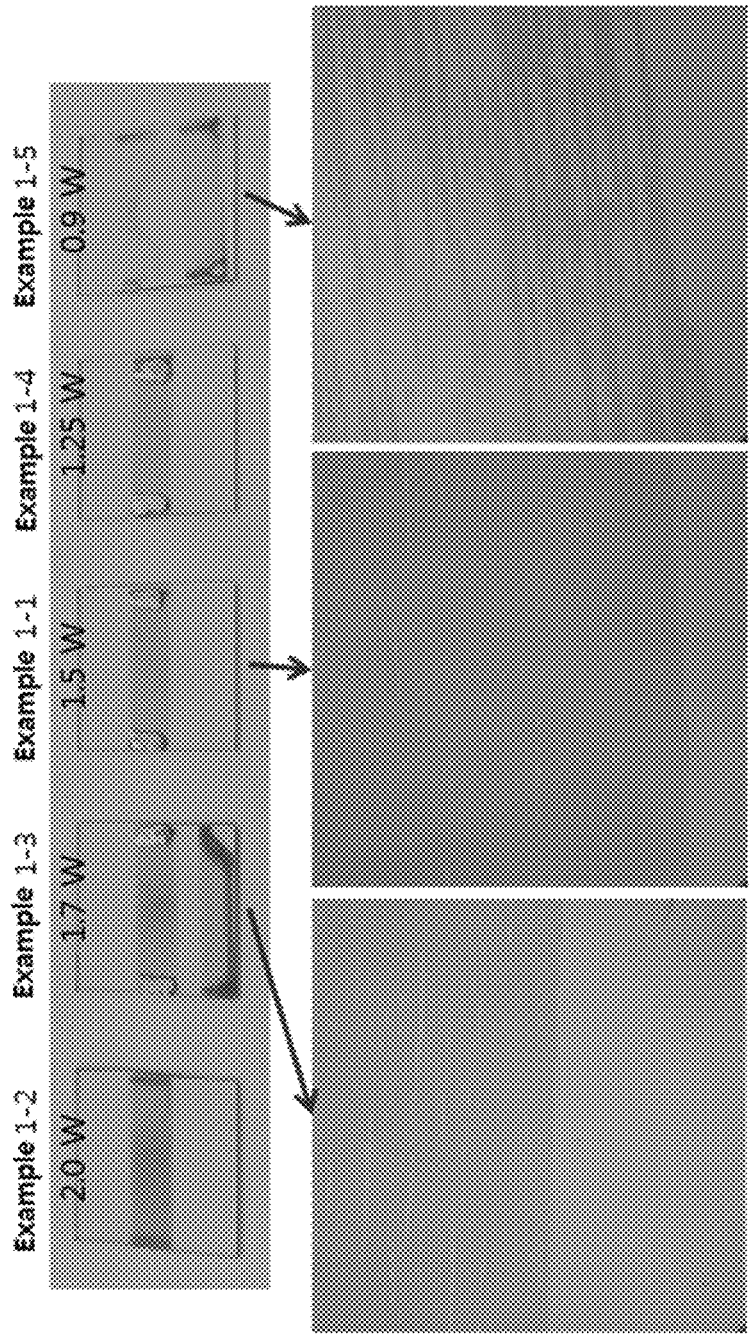
FIG. 4 shows photographs and optical images of conductive polymer thin films having PEDOT:PSS patterns of Example 1.

With reference to FIG. 4, when a laser was radiated to the polymer solution at an intensity of 0.9 W, severe delamination of PEDOT:PSS occurred, and when a laser was radiated at an intensity of 1.7 W, delamination and carbonization of the PEDOT:PSS polymer film occurred simultaneously. On the other hand, little delamination occurred at a laser intensity of 1.5 W.

Also, the resistance of the PEDOT:PSS thin film patterned by radiating a laser at an intensity of 1.7 W to the polymer solution was 1.6 kΩ, the resistance of the PEDOT:PSS thin film patterned by radiating a laser at an intensity of 0.9 W was 5.7 kΩ, and the resistance of the thin film manufactured by radiating a laser at an intensity of 1.5 W was 1.2 kΩ.

Therefore, when a pattern was formed by radiating a laser to the coating layer coated with the solution including the PEDOT:PSS polymer, the intensity of the laser had an influence on the resistance and morphology of the thin film. Furthermore, when using a laser at an intensity of 1.5 W for the thin film thickness performed in Example 1, preferred electrical conductivity and pattern formation were confirmed to be induced.

Test Example 2: Analysis of Polymer Pattern Morphology Depending on Soft Baking Temperature FIG. 5 shows photographs and optical images of the PEDOT:PSS thin film pattern morphology depending on the soft baking temperature and time.

Figure 5:
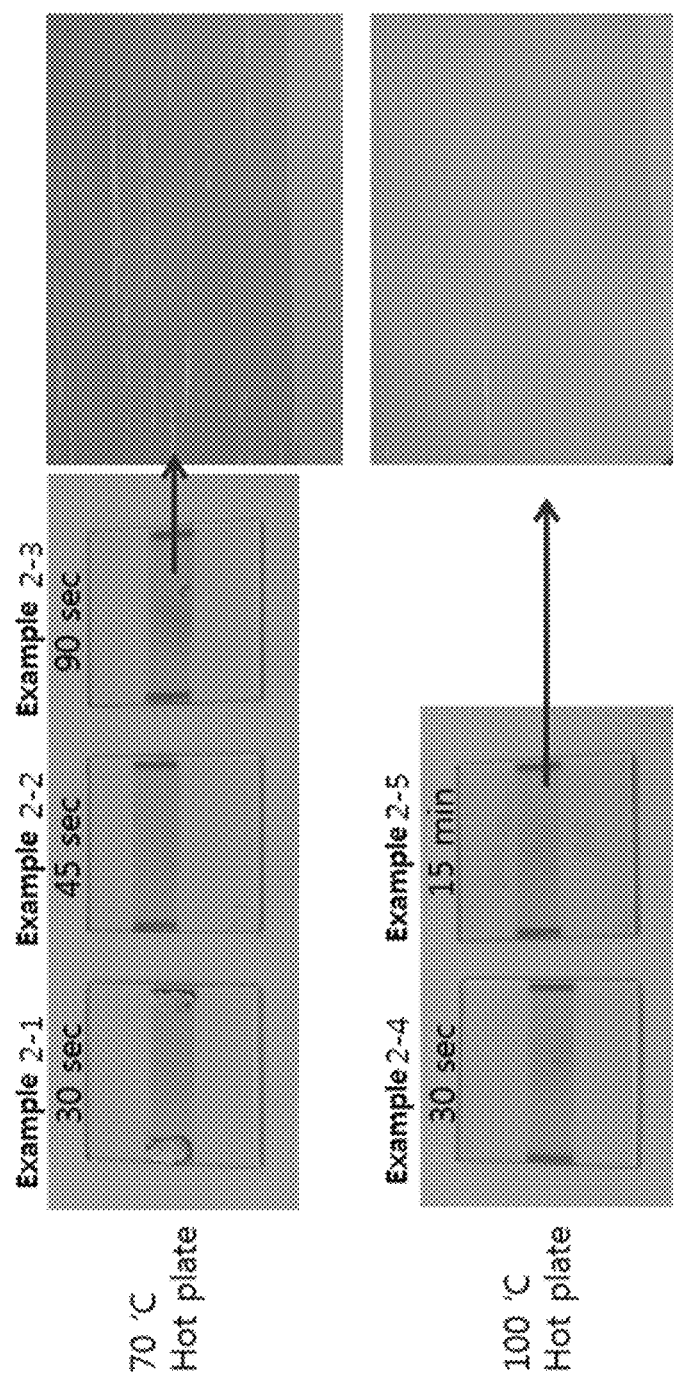
FIG. 5 shows photographs and optical images of conductive polymer thin films having PEDOT:PSS patterns of Example 2.

With reference to FIG. 5, PEDOT:PSS was confirmed to remain on the non-patterned region of the surface of glass when the soft baking time was 45 sec or more at a soft baking temperature of 70° C., and was also confirmed to remain in a considerably large amount at a soft baking temperature of 100° C. As the soft baking conditions became harsh, the amount of PEDOT:PSS remaining was increased.

These results show that the soft baking conditions (temperature and time) are closely associated with an increase in the precision of the PEDOT:PSS thin film pattern. When soft baking is performed under excessively harsh conditions, the amount of PEDOT:PSS remaining between PEDOT:PSS thin film patterns increases, thus causing leakage current in which electricity flows in places where electricity is not required to flow, undesirably deteriorating device performance.

Test Example 3: Analysis of Polymer Pattern Morphology Depending on Whether or not Soft Baking was Performed FIG. 6 shows photographs and optical images of the patterned PEDOT:PSS thin films depending on whether or not soft baking was performed in Examples 3-1 and 3-2.

Figure 6:
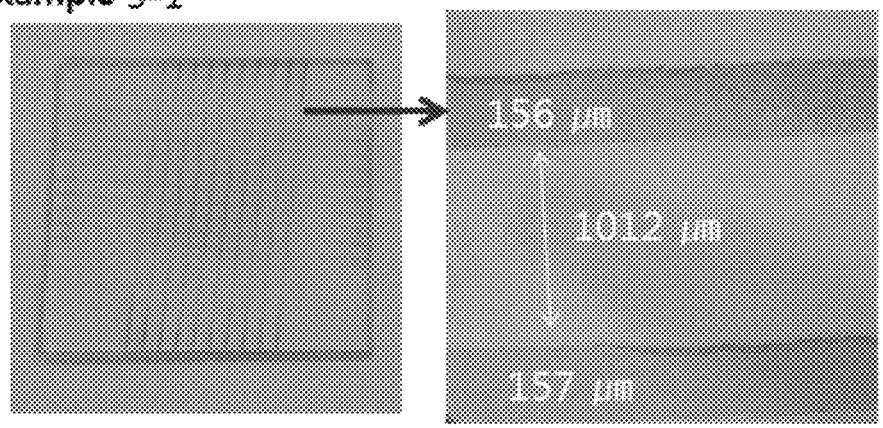
FIG. 6 shows photographs and optical images of conductive polymer thin films having PEDOT:PSS patterns of Example 3.
Figure 6:
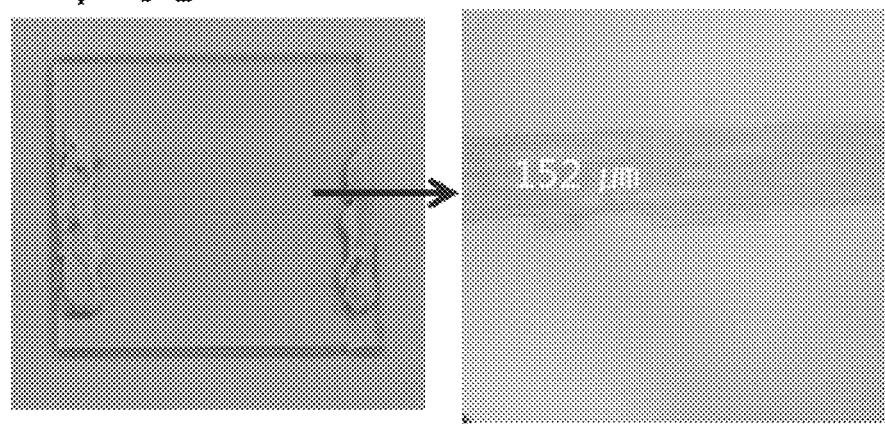

With reference to FIG. 6, the thin film formed without soft baking in Example 3-1 was patterned normally and PEDOT:PSS remaining between patterns was not observed. However, as seen in the microscopic image, a carbonized portion was observed in the pattern, and thus the resistance of the pattern of Example 3-1 was measured to be as high as 2 MΩ or more. In contrast, the thin film formed through soft baking at 70° C. for 30 sec in Example 3-2 was measured to have a resistance of 3.3 kΩ.

Therefore, the soft baking process is regarded as very important in the formation of the PEDOT:PSS thin film pattern according to the present invention, and the soft baking process can be found to have a significant effect on improving the pattern precision of the thin film and the electrical characteristics thereof.

Test Example 4: Analysis of Polymer Pattern Morphology Depending on Decrease in Pattern Size FIGS. 7 and 8 show the results of analysis of the thickness of the patterned PEDOT:PSS thin films of Example 3-2 and Example 4-1.

Figure 7:
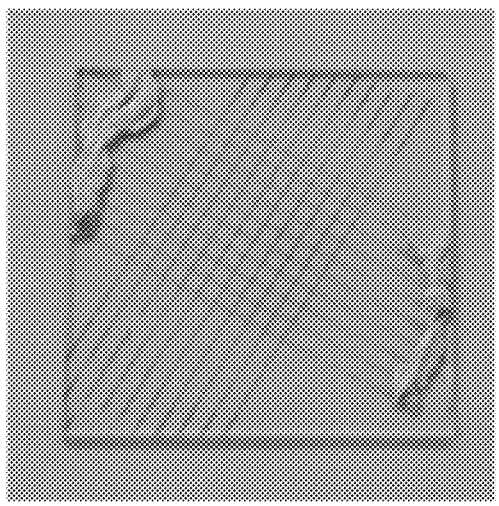
FIG. 7 shows the results of analysis of the thickness of a conductive polymer thin film having a PEDOT:PSS pattern of Example 4.
Figure 7:
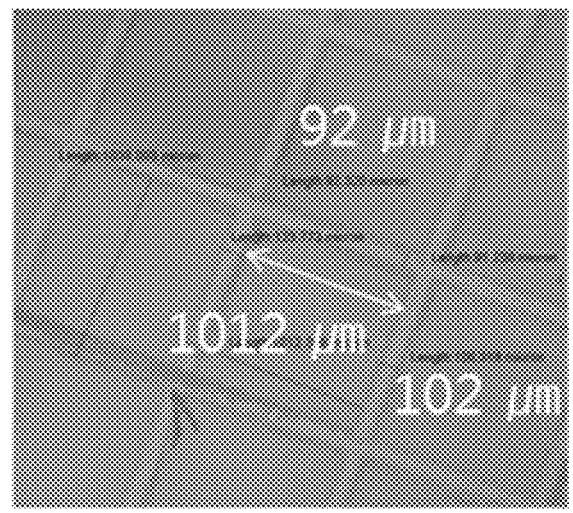
Figure 8:
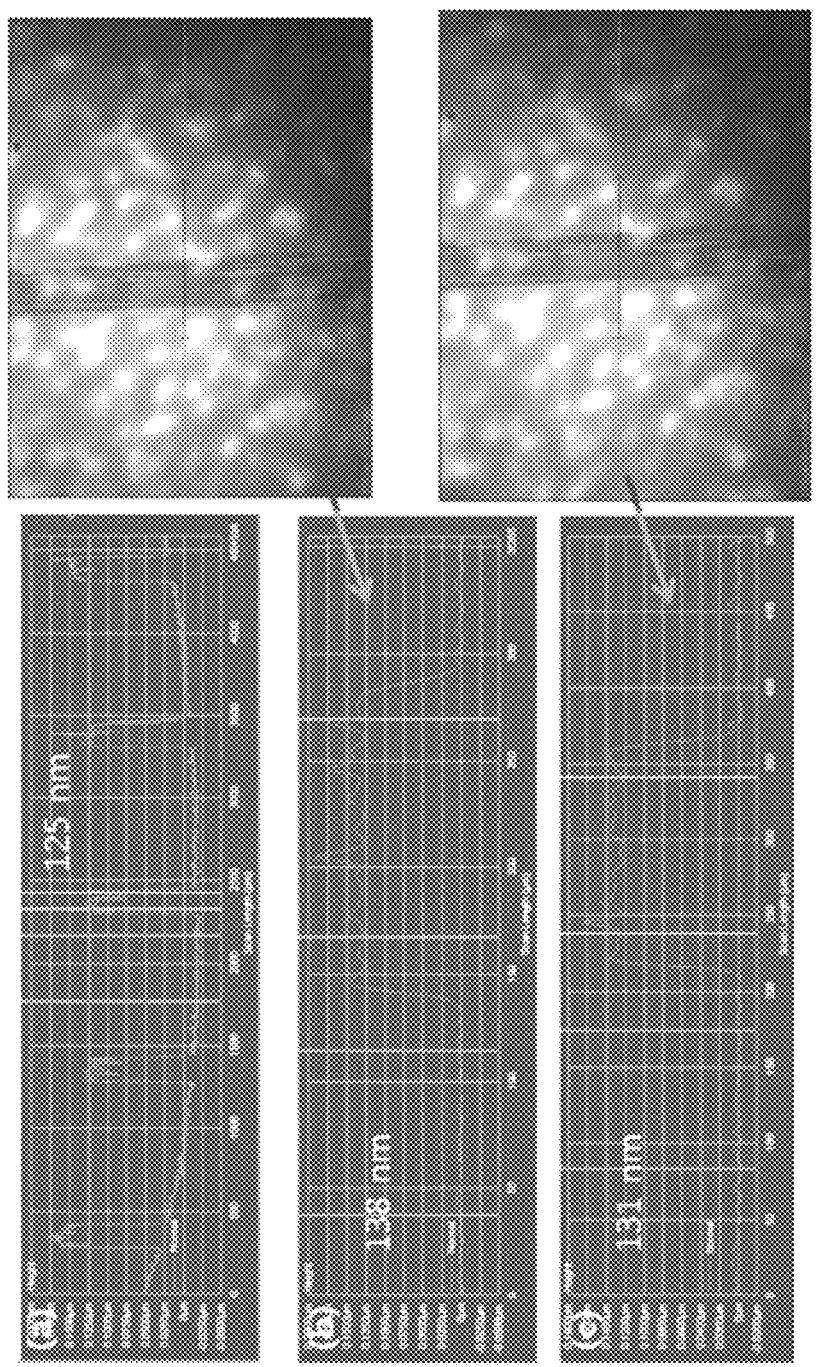
FIG. 8 shows the results of analysis of the thickness of the conductive polymer thin film having a PEDOT:PSS pattern according to an embodiment of the present invention.

With reference to FIG. 7, the thin film of Example 4-1 having a pattern of 200 mm×0.05 mm was measured to have a resistance of 2 kΩ, and even a small pattern of 0.05 mm was comparatively uniformly formed. However, based on the results of microscopic measurement of pattern size of FIGS. 6 and 7, the actual sizes of the thin film pattern were set to 100 μm and 50 μm, respectively, but the finally obtained thin film pattern sizes were measured to be 150 μm and 100 μm, respectively, thereby being enlarged by 50 μm.

This is deemed to be because the light source used for pattern formation was a laser having a spot diameter of 50 µm and thus a pattern of about 25 µm was additionally formed at each of both ends of the pattern based on the characteristics of a laser having a Gaussian power distribution.

Therefore, it is judged that the minimum pattern size is closely related to the spot size of the laser light source when the patterning process using a laser as the light source is performed.

With reference to (a) and (b) of FIG. 8, the patterned PEDOT:PSS thin film of Example 3-2 was measured to have a thickness of 125 to 138 nm, and with reference to (c) of FIG. 8, the patterned PEDOT:PSS thin film of Example 4-1 was measured to have a thickness of 131 nm.

These results show that there is no significant difference in the thickness of the formed thin film pattern even when the pattern size and the soft baking conditions are changed.

Test Example 5: Analysis of Resistance and Electrical Conductivity

The results of sheet resistance and conductivity depending on the PEDOT:PSS thin film preparation conditions (spin coating rate) and on whether or not patterning was performed are summarized in Table 2 below.

TABLE 2

| PEDOT:PSS thin film preparation conditions (Spin coating rate) | Patterning or not | Sheet resistance (Ω/□) | Conductivity (S/cm) |
|---|---|---|---|
| 1000 rpm | NO | 97,700 | 1 |
| 1000 rpm | YES | 102.6 | 974 |
| 1500 rpm | NO | 151,000 | — |
| 1500 rpm | YES | 147.1 | 709 |
| 1800 rpm | NO | 160,000 | — |
| 1800 rpm | YES | 168.8 | 742 |
| 2000 rpm | NO | 188,000 | — |
| 2000 rpm | YES | 175.9 | 761 |
| 2500 rpm | NO | 201,000 | — |
| 2500 rpm | YES | 195.4 | 724 |

As is apparent from Table 2, when the spin coating rate for preparing the PEDOT:PSS thin film was increased, the thickness of the formed PEDOT:PSS thin film was decreased, and thus the sheet resistance was increased.

Also, when the patterning was performed regardless of the PEDOT:PSS thin film preparation conditions, the sheet resistance was drastically decreased and the electrical conductivity was increased.

Furthermore, the electrical conductivity of the PEDOT:PSS thin film formed under the condition that 1000 rpm was applied and patterning was performed was determined to be the highest.

Test Example 6: Analysis of Transmittance

Figure 9:
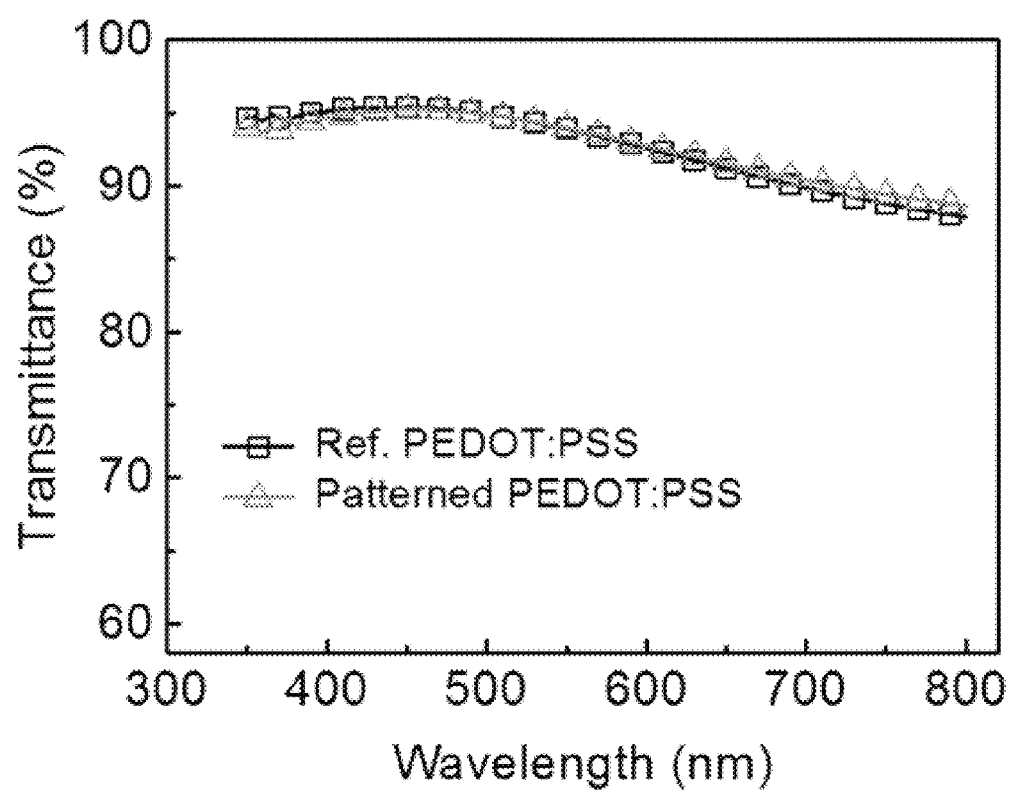
FIG. 9 shows the results of analysis of transmittance depending on whether or not the pattern is formed.

FIG. 9 shows the results of measurement of transmittance of a PEDOT:PSS thin film (Ref. PEDOT:PSS) in which laser patterning was not performed and the PEDOT:PSS thin film in which the patterning was performed at 1.5 W as in Example 1-1, after spin coating with the PEDOT:PSS solution in Example 1.

With reference to FIG. 9, the transmittance of the PEDOT:PSS thin film having no pattern was almost the same as that of the PEDOT:PSS thin film having a pattern.

Test Example 7: Analysis of Light Absorption of PEDOT:PSS Thin Film and PSS Thin Film FIG. 10 shows the results of measurement of light absorption of the PEDOT:PSS thin film and the PSS thin film. The light wavelength optimal for patterning the PEDOT:PSS thin film may be obtained.

With reference to FIG. 10, based on the results of measurement of light absorption of a PEDOT:PSS thin film obtained by coating a quartz substrate with PEDOT:PSS (4 wt % in DIW) at 1500 rpm and a PSS thin film obtained through coating with PSS (20 wt % in DIW) at 1500 rpm, the PSS thin film was increased in UV light absorption at a wavelength of less than 400 nm, but the PEDOT:PSS thin film including PEDOT was steadily increased in light absorption from 600 nm.

Therefore, the light wavelength suitable for patterning the PEDOT:PSS thin film is concluded to be 500 nm or more.

Test Example 8: Analysis of Optimal Laser Power Depending on Thickness of PEDOT:PSS Thin Film FIG. 11 shows the results of measurement of the sheet resistance of the PEDOT:PSS thin film patterns at various thicknesses depending on changes in laser power at a fixed scanning speed of 2000 mm/sec using a 1064 nm Nd:YAG laser having a spot diameter of 50 µm.

Figure 11:
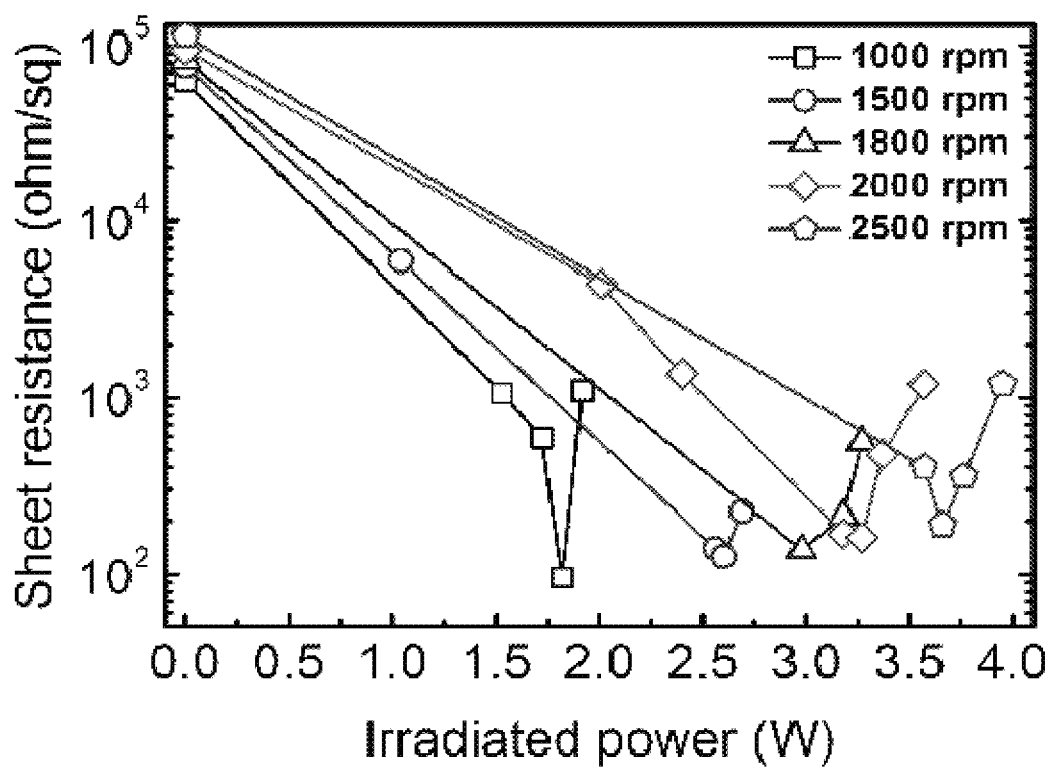
FIG. 11 shows the results of measurement of thickness and light (laser) power of the PEDOT:PSS thin film.

With reference to FIG. 11, the light irradiation energy region per unit area of a PEDOT:PSS thin film having a given thickness may be set. The glass substrate was coated with PEDOT:PSS (4 wt % in DIW) at different rpm, and changes in sheet resistance were measured at different power values of a 1064 nm laser. As results thereof, the obtained thickness was 125 nm at 1000 rpm, 96 nm at 1500 rpm, 80 nm at 1800 rpm, 75 nm at 2000 rpm, and 70 nm at 2500 rpm.

For the PEDOT:PSS thin film patterns at individual thicknesses, the minimum sheet resistance was measured at a laser power of 1.7 W at 1000 rpm, 2.6 W at 1500 rpm, 3.0 W at 1800 rpm, 3.3 W at 2000 rpm, and 3.7 W at 2500 rpm.

This phenomenon shows that the absorption coefficient of the PEDOT:PSS thin film is a unique characteristic of material and is thus constant regardless of the thickness, but that the total light absorption efficiency increases drastically with an increase in the thickness. Therefore, the energy required to induce structural change through inductive heat generation due to light absorption of a PEDOT:PSS thin film having a high thickness is low compared to the energy of a PEDOT:PSS thin film having a small thickness. Specifically, the PEDOT:PSS thin film having a thickness of about 125 nm enables the PEDOT:PSS core-shell structure to change at a weak power of 1.7 W, but the PEDOT:PSS thin film having a thickness of 70 nm may be structurally changed at a high power of 3.7 W. It is apparent that such optimal power conditions are determined depending on the thermal conductivity of the substrate that is used.

Therefore, the intensity of light per unit area (1 cm$^2$) of a 1 nm thick PEDOT:PSS thin film is determined to be $1\times10^7$ to $1\times10^9$ W/cm$^2$-nm.

Test Example 9: TGA of PEDOT:PSS Thin Film and PSS Thin Film

Figure 12:
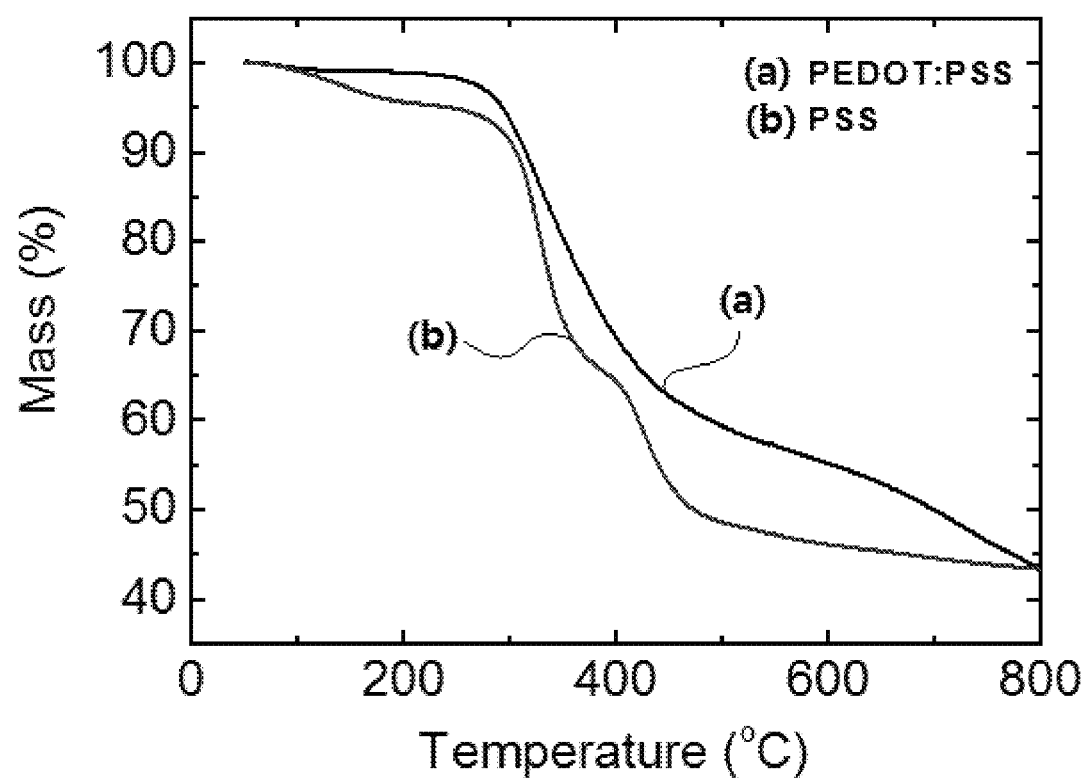
FIG. 12 shows the results of thermogravimetric analysis (TGA) of the PEDOT:PSS thin film and the PSS thin film.

FIG. 12 shows the results of TGA (Thermogravimetric analysis) in order to evaluate the thermal stability of the PEDOT:PSS thin film and the PSS thin film.

With reference to FIG. 12, the thermal deformation of the PEDOT:PSS thin film is assumed to be mainly caused by PSS, and PEDOT is highly resistant to heat and PSS is easily melted by the transferred heat and thus prone to be rearranged.

Analysis of Structure of Modified PEDOT:PSS Cluster

The structure and morphology of the modified PEDOT:PSS in Test Examples 10 and 11 below were analyzed.

Test Example 10: Analysis of XPS and UV-Vis Spectroscopy Depending on Laser Conditions Radiated to PEDOT:PSS Thin Film FIG. 13 shows the results of XPS (X-ray photoelectron spectroscopy) and UV-Vis spectroscopy (Ultraviolet-visible spectroscopy) under laser conditions radiated to the PEDOT:PSS thin film (no laser: a sample where conductivity is not increased even upon laser irradiation, about 0.5 S/cm; low laser: weak laser before conductivity optimization, 100 to 300 S/cm; optimum laser: laser for optimizing conductivity, 700 to 900 S/cm; high laser: a sample where conductivity is drastically decreased due to laser power stronger than the optimum laser).

Figure 13:
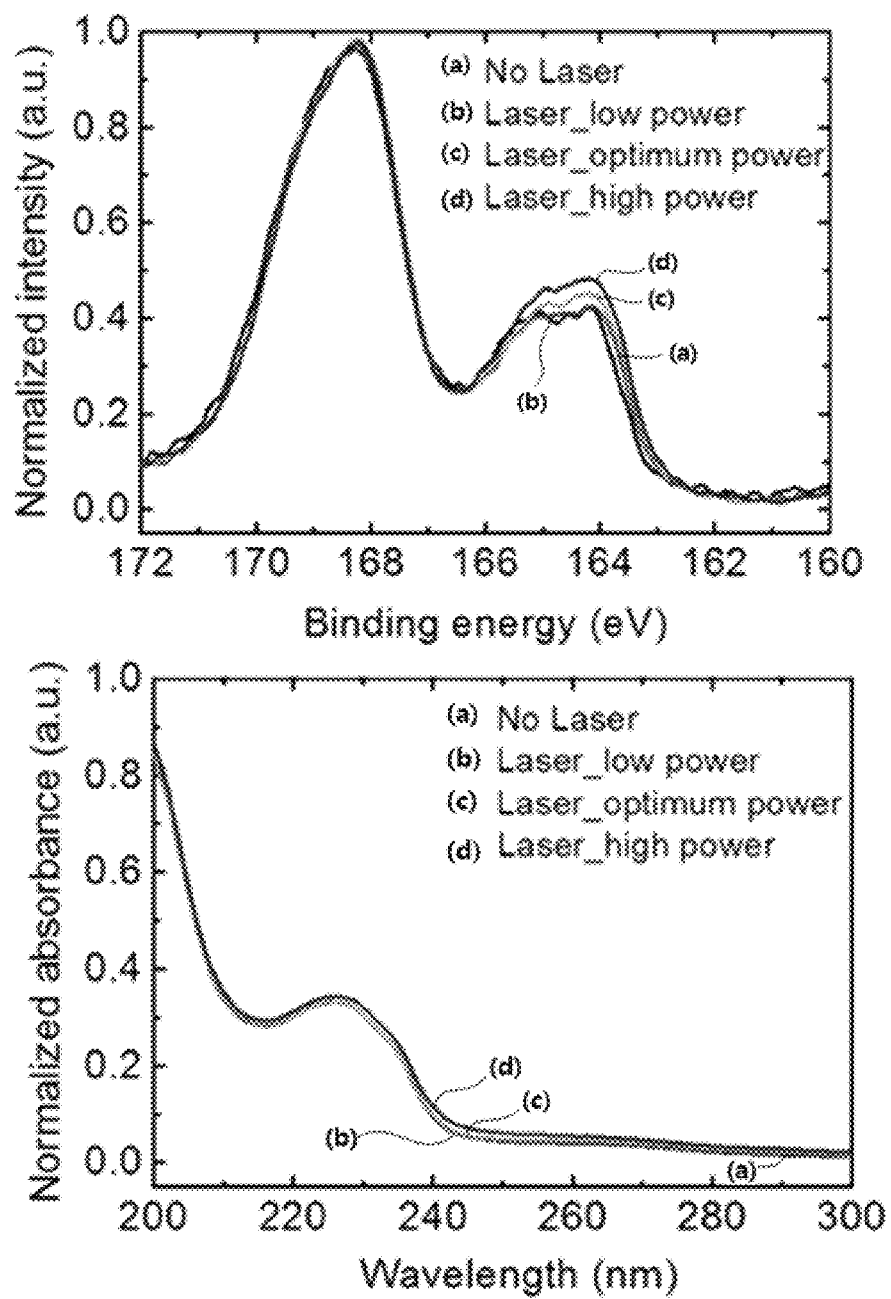
FIG. 13 shows the results of X-ray photoelectron spectroscopy (XPS) and UV-Vis spectroscopy of the thin film depending on the light (laser) intensity.

With reference to FIG. 13, the intensity of the PEDOT peak was gradually increased with an increase in laser power under the condition that the PSS peak intensity having high sensitivity was normalized to 1. Since XPS is a method of analyzing information on the surface of a sample less than ones of nm in size, changes in the amounts of PSS and PEDOT on the surface of the PEDOT:PSS sample irradiated with the laser were inferred, and in particular the amount of PEDOT was determined to increase.

Based on the results of UV-Vis spectroscopy, PSS strongly absorbed light of less than 240 nm, and the absorption values were almost the same before and after laser treatment and depending on laser treatment conditions. Also, the measured results show the total transmittance of the PEDOT:PSS thin film, and thus there were little changes in the amount of PSS in the entire thin film.

Therefore, the PEDOT cores were surrounded by PSS shells of the surface of the PEDOT:PSS film and were not initially measured, but the PSS shells were melted and rearranged and thus PEDOT was exposed, whereby the amount of PEDOT was analyzed to relatively increase.

Test Example 11: Raman Analysis Depending on Laser Conditions Radiated to PEDOT:PSS Thin Film FIG. 14 shows the results of Raman spectroscopy of Raman shift under laser conditions radiated to the PEDOT:PSS thin film (no laser: a sample where conductivity is not increased even upon laser irradiation, about 0.5 S/cm; low laser: weak laser before conductivity optimization, 100 to 300 S/cm; optimum laser: laser for optimizing conductivity, 700 to 900 S/cm; high laser: a sample where conductivity is drastically decreased due to laser power stronger than the optimum laser).

Figure 14:
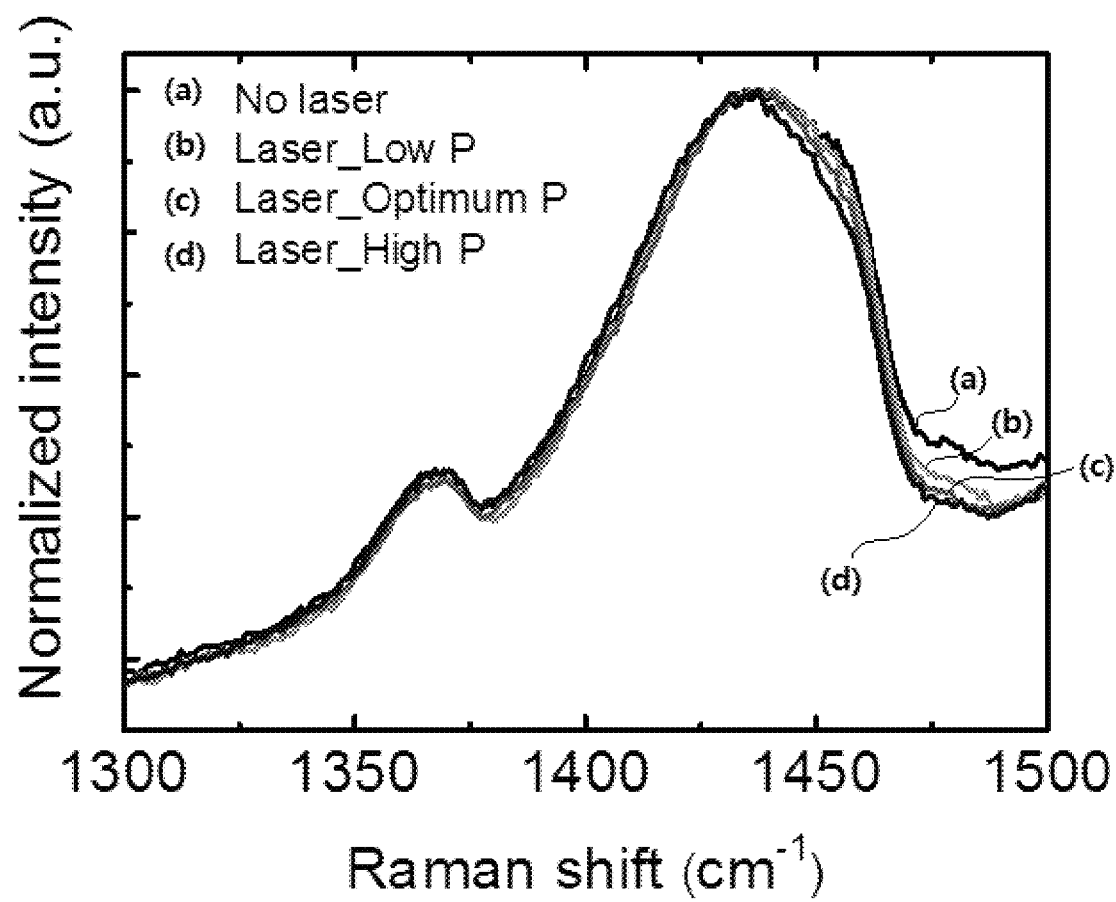
FIG. 14 shows the results of Raman measurement of the thin film depending on the light (laser) intensity.

With reference to FIG. 14, the strongest peak band (1380 to 1470 $cm^{-1}$) observed through Raman shift corresponds to the symmetrical $C\alpha=C\beta$ stretching mode of the aromatic ring of the PEDOT chain, which is the information corresponding to the PEDOT core. The cores contained in the modified PEDOT:PSS cluster through light irradiation of the present invention were confirmed to have little Raman shift in the range of 1380 to 1470 $cm^{-1}$ compared to no light irradiation.

Referring to J. Mater. Chem. C, 2014, 2, 764, "Fabrication of highly transparent and conducting PEDOT:PSS films using a formic acid treatment", in order to increase the conductivity of the PEDOT:PSS thin film, a formic acid aqueous solution was dropped onto a transparent electrode substrate coated with PEDOT:PSS having low conductivity, dried, washed with water, and then dried, thus manufacturing a PEDOT:PSS transparent electrode substrate. Here, the Raman shift peak of the transparent electrode substrate treated with formic acid was shifted toward 1380 $cm^{-1}$ compared to when not treated with any chemical, and thus the physical-chemical arrangement of the PEDOT cores was changed to thus exhibit a structure different from that of the PEDOT having low conductivity.

Therefore, in the present invention, it can be inferred that the physical-chemical changes in the cores of the PEDOT:PSS cluster modified through light irradiation did not occur compared to the cores of a PEDOT:PSS cluster without light irradiation.

The scope of the invention is represented by the claims below rather than the aforementioned detailed description, and all of the changes or modified forms that are capable of being derived from the meaning, range, and equivalent concepts of the appended claims should be construed as being included in the scope of the present invention.

What is claimed is:

1. A method of forming a conductive polymer thin film pattern, comprising:
    (a) coating a substrate with a solution including PEDOT:PSS (poly(3,4-ethylenedioxythiophene):poly(styrene sulfonate)), thus forming a coating layer including the solution on the substrate;
    (b) irradiating a predetermined portion of the coating layer with light, thus manufacturing a pre-patterned substrate including PEDOT:PSS patterned on the predetermined portion and the coating layer other than the predetermined portion; and
    (c) removing the coating layer other than predetermined portion from the prepatterned substrate, thus manufacturing a conductive polymer thin film having a PEDOT:PSS patterned on the predetermined portion,
    wherein in step (b), the PEDOT:PSS patterned on the predetermined portion is solidified,
    wherein a wavelength of the light is 500 nm to 10 µm; and
    wherein an intensity of the light is $1\times10^7$ to $1\times10^{10}$ $W/cm^2 \cdot nm$ for a 1 $cm^2$ area of a 1 nm thick PEDOT:PSS thin film.

2. The method of claim 1, wherein the light includes at least one selected from among a laser, a multi-wavelength lamp, a xenon lamp, a single-wavelength lamp, a monochromator, a flash lamp, and an optical tool using the laser, the multi-wavelength lamp, the xenon lamp, the single-wavelength lamp, the monochromator or the flash lamp as a light source.

3. The method of claim 1, further comprising subjecting the coating layer to soft baking, after step (a).

4. The method of claim 3, wherein the soft baking is performed through heat treatment at a temperature ranging from 10 to 200° C. to evaporate a portion of a solvent of the coating layer.

5. The method of claim 4, wherein the soft baking is performed for 1 to 1,000 sec.

6. The method of claim 1, wherein the solution includes a PEDOT:PSS polymer and a solvent.

7. The method of claim 1, wherein the solution has a concentration of 0.1 to 10 wt %.

8. The method of claim 6, wherein the solvent is a polar solvent.

9. The method of claim 1, wherein the solution further includes a conductive material.

10. The method of claim 9, wherein the conductive material includes at least one selected from among gold (Au), nickel (Ni), cobalt (Co), iridium (Ir), aluminum (Al), silver (Ag), titanium (Ti), vanadium (V), chromium (Cr) and manganese (Mn).

11. The method of claim 1, wherein in step (b), a solvent contained in the solution including PEDOT:PSS is evaporated through light irradiation.

12. The method of claim 1, wherein in step (b), the coating layer is directly irradiated with light.

13. The method of claim 1, wherein in step (c), the removing the coating layer is performed by dipping or washing the pre-patterned substrate in or with a washing solvent.

14. The method of claim 1, wherein in step (b), heat is generated inside a PEDOT:PSS polymer contained in the coating layer through light irradiation.

15. The method of claim 14, wherein an electrical resistance of the PEDOT:PSS polymer is decreased due to the heat that is internally generated.

16. The method of claim 1, wherein the conductive polymer thin film having a PEDOT:PSS pattern has a thickness of 5 nm to 5 pm.

* * * * *